United States Patent [19]

Wilkinson

[11] Patent Number: 5,214,676
[45] Date of Patent: May 25, 1993

[54] DIGITAL PHASE DETECTOR ARRANGEMENTS

[75] Inventor: James H. Wilkinson, Heathlands, England

[73] Assignee: Sony Broadcast & Communications Ltd., Basingstoke, England

[21] Appl. No.: 674,384

[22] Filed: Mar. 25, 1991

[30] Foreign Application Priority Data

Apr. 3, 1990 [GB] United Kingdom ............... 9007496

[51] Int. Cl.⁵ .............................................. H04L 7/02
[52] U.S. Cl. ................................. 375/118; 364/724.1; 328/127
[58] Field of Search ................ 375/118, 110, 80, 81; 358/149; 364/732, 733, 828, 829, 724.1; 328/127; 330/2

[56] References Cited

U.S. PATENT DOCUMENTS 3,209,261  9/1965  Gritchlow .......................... 375/110
4,692,931  9/1987  Ohsawa ............................. 375/106
4,893,341  1/1990  Gehring ............................. 381/2

FOREIGN PATENT DOCUMENTS 177100  4/1986  European Pat. Off. .
239412  9/1987  European Pat. Off. .
262842  4/1988  European Pat. Off. .
2045581  2/1980  United Kingdom .
83/03175  3/1983  World Int. Prop. O. .

OTHER PUBLICATIONS

Patent Abstracts of Japan, vol. 13, No. 453 (E-831) Oct. 11, 1989 & JP-A-1 175 310 (Sony) Jul. 11, 1989.
Patent Abstracts of Japan, vol. 13, No. 81 (E-719) Feb. 23, 1989 & JP-A-63 261 912 (Hitachi) Oct. 28, 1988.

Primary Examiner—Curtis Kuntz
Assistant Examiner—Tesfaldet Bocure
Attorney, Agent, or Firm—William S. Frommer; Alvin Sinderbrand

[57] ABSTRACT

In a digital phase detector arrangement, the combination of a digital phase detector for deriving a digital output signal representing the phase differences between two input clock signals supplied to the phase detector, and a circuit for reducing jitter in the output signal; the circuit comprising a differentiator for differentiating the output signal to produce a differentiated signal, a low-pass filter for low-pass filtering the differentiated signal to produce a filtered signal, and an integrator for integrating the filter signal to produce a further digital output signal from which at least some jitter has been removed by the low-pass filter.

15 Claims, 4 Drawing Sheets

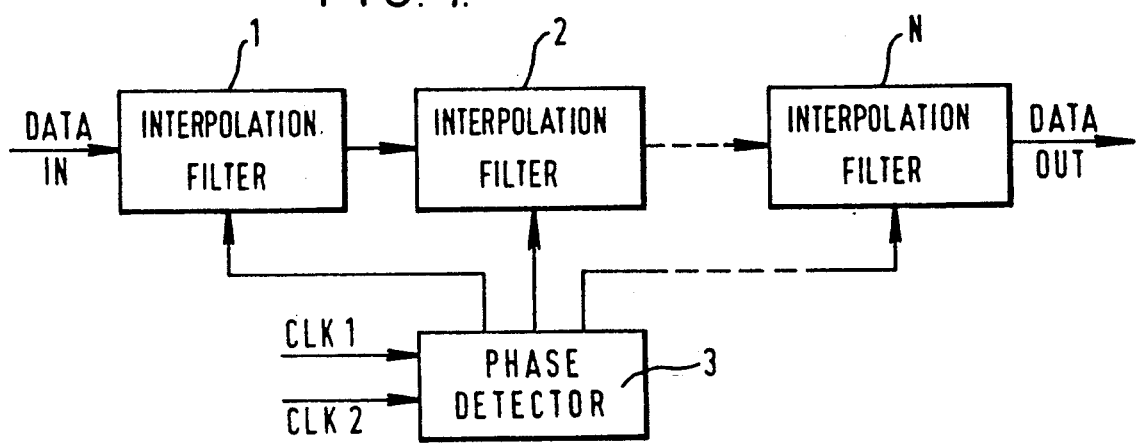
FIG. 1.
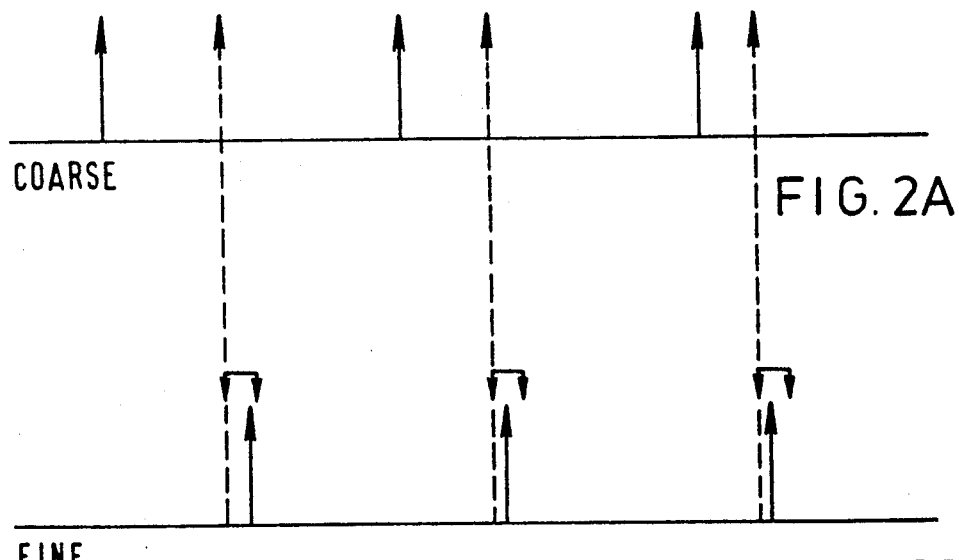
FIG. 2A.
FIG. 2B

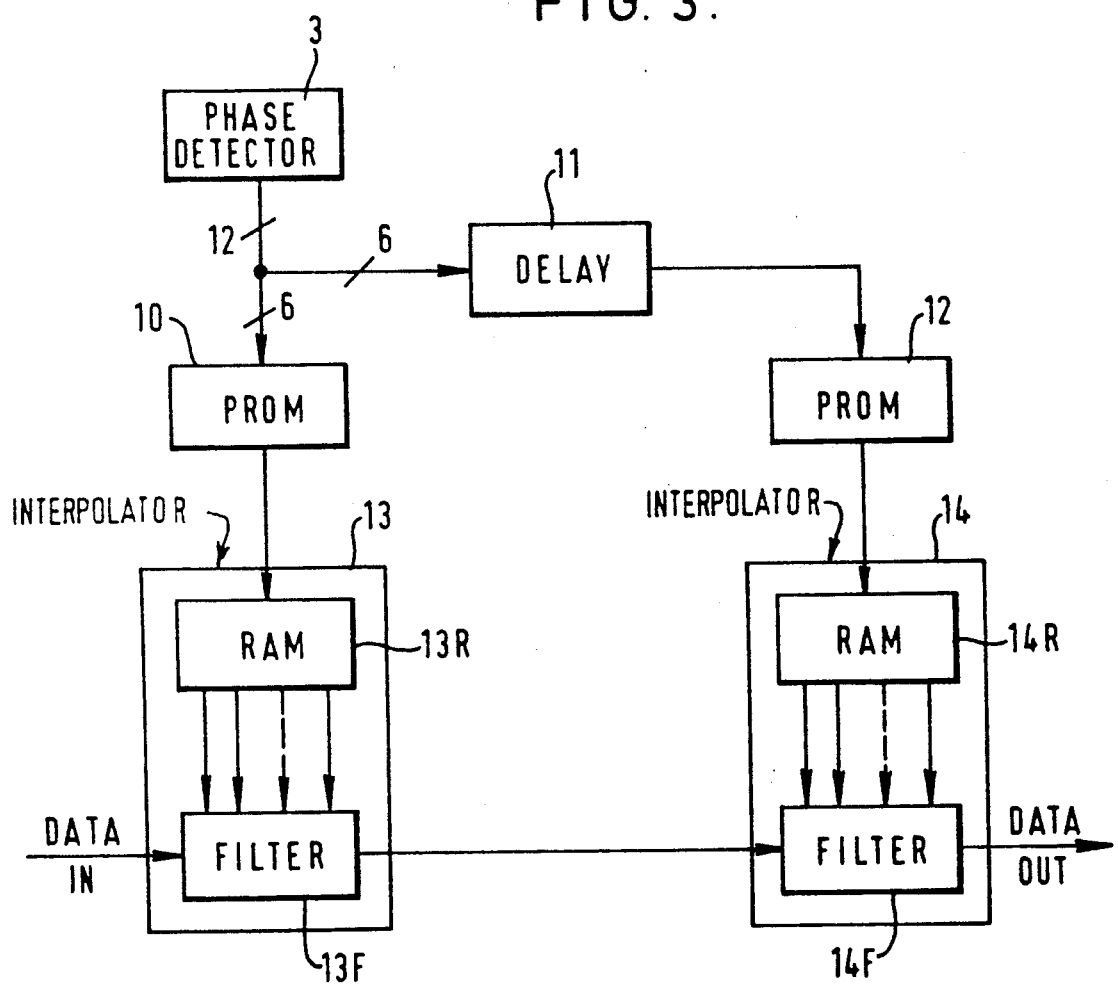

5,214,676

DIGITAL PHASE DETECTOR ARRANGEMENTS

BACKGROUND OF THE INVENTION

1. Field of the Invention

This invention relates to digital phase detector arrangements. Such phase detector arrangements are particularly, but not exclusively, suitable for use in digital signal interpolation, and the invention also relates to digital signal interpolator arrangements.

2. Description of the Prior Art

To change a sampled auido or video signal from one sampling frequency to another, a liner signal interpolator is required. An example of the type of conversion necessary for a video signal is the change from a sampling frequency of 13.5 MHz to 4 fsc, where fsc is the sub-carrier frequency of a PAL television signal (4.43361875 MHz). Such a conversion does not have any simple integral relationship between the two frequencies, or to put it somewhat differently, the new samples which need to be derived to form the output signal may occur almost anywhere in the time intervals between the samples of the input signal.

Such interpolation can be done using digital phase shift interpolators, but because there is no simple integral relationship between the two frequencies, an accurate means of determining the phase differences between two input clock pulse signals is essential to the process of deriving a control signal for the interpolator. Thus for digital audio and digital video applications, a phase detector is required whose output exhibits low levels of jitter; typically a jitter of less than 0.1 nsec.

SUMMARY OF THE INVENTION

One object of the present invention is to provide a digital phase detector arrangement with means to reduce jitter in the output signal thereof.

Another object of the present invention is to provide an improved digital signal interpolator arrangement.

Another object of the present invention is to provide a digital signal interpolator arrangement comprising a phase detector which exhibits low jitter.

According to the present invention there is provided in a digital phase detector arrangement, the combination of.

a digital phase detector for deriving a digital output signal representing the phase differences between two input clock signals supplied to the phase detector; and circuit means for reducing jitter in said output signal; said circuit means comprising:

a differentiator for differentiating said output signal to produce a differentiated signal;

a low-pass filter for low-pass filtering said differentiated signal to produce a filtered signal; and an integrator for integrating said filtered signal to produce a further digital output signal from which at least some jitter has been removed by said low-pass filter.

The above, and other objects, features and advantages of this invention will be apparent from the following detailed description of illustrative embodiments which is to be read in connection with the accompanying drawings.

BRIEF DESCRIPTION OF THE DRAWINGS

FIG. 1 shows in simple block diagrammatic form an embodiment of digital signal interpolator arrangement according to the present invention;

FIGS. 2(A) and 2(B) are timing diagram for explaining a method of digital signal interpolation;

FIG. 3 shows in more detailed block diagrammatic form an embodiment of digital signal interpolator arrangement according to the present invention;

DESCRIPTION OF THE PREFERRED EMBODIMENTS

Figures 4, 5A, 5B, 5C:
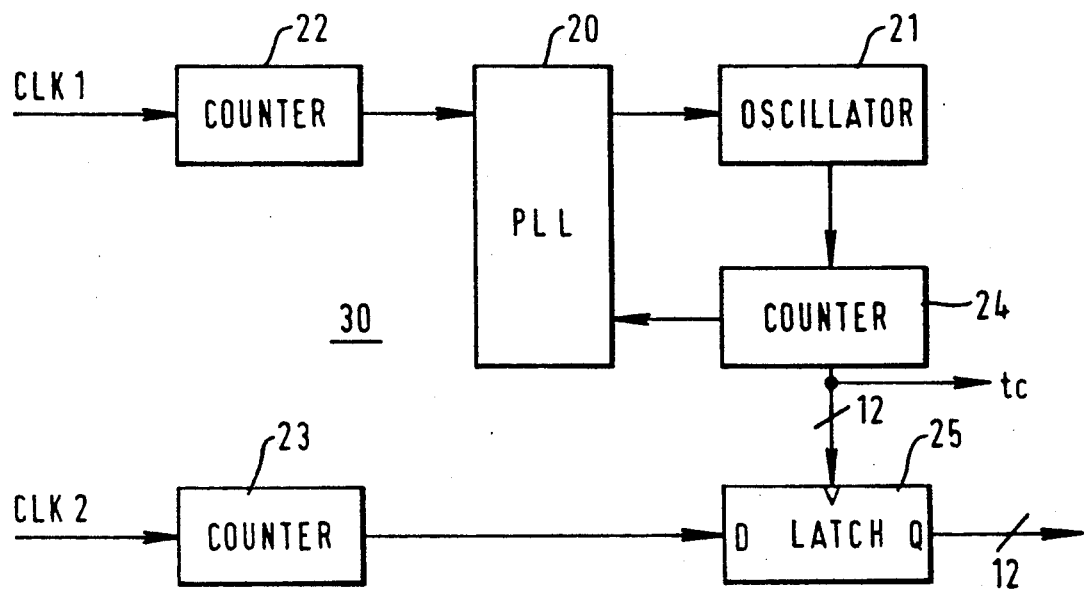
FIG. 4 shows in block diagrammatic form part of an embodiment of digital phase detector arrangement according to the present invention.
FIGS. 5(A)–5(C) are timing diagram for explaining the operation of the circuit of FIG. 4.

Referring to FIG. 1, this shows a digital signal interpolator arrangement comprising a cascaded series of N multi-tap interpolation filters 1, 2, ... N, an input digital signal comprising multi-bit pulse code modulated (PCM) samples at a given sample rate being supplied to the interpolation filter 1, and an output digital signal comprising similar multi-bit PCM samples at a required different sample rate being derived from the interpolation filter N.

Each of the interpolation filters 1 to N is preferably formed as an integrated circuit comprising random access memory (RAM) in which a plurality of tap sets are stored, for selective supply to an associated digital filter. In operation, the tap sets are dynamically selected input sample by input sample, under control of a digital signal derived by a digital phase detector 3 from clock pulse signals CLK1 and CLK2 corresponding respectively in frequency to the input and output digital signals, for supply to the associated digital filter. The interpolation filter 1 performs an initial coarse interpolation, and the interpolation filters 2 to N each perform progressively finer interpolation. The number N of interpolation filter required will depend on the sample rate conversion that is to be performed, the number of taps that the filters have, and the number of tap sets stored in RAM for each filter. This will be better understood after consideration of FIGS. 2 and 3, and the description relating thereto.

The connections between the successive interpolation filter 1 to N are full resolution digital connections, as otherwise there will be cumulative errors due to round-off effects.

FIG. 2A shows diagrammatically a first stage of coarse interpolation drawn along a horizontal time axis. The solid vertical arrows represent successive samples of an input digital signal having a given sample rate, and the broken vertical arrows represent successive interpolated samples, such as might for example be derived by the interpolation filter 1 of FIG. 1 and which have a different, interpolated, sample rate. Suppose that the time interval between successive input samples is ts and that the interpolation filter has 64 tap sets. The first interpolated sample will then follow the first input sample after a time interval of $n \times ts/64$, where $0 \leq n \leq 63$.

FIG. 2B shows diagrammatically a second stage of fine interpolation. The solid vertical arrows represent successive more finely interpolated samples, such as might for example be derived by the interpolation filter 2 of FIG. 1. In FIG. 2B, the horizontal lines with depending arrows indicate the range of positions of the respective interpolated samples, and this should be compared with FIG. 2A, where an interpolated sample can have any (coarsely defined) position between two successive input samples. Using the same notation as in FIG. 2A, the first finely interpolated sample in FIG. 2B will follow the first coarsely interpolated sample after a time interval of $n \times ts/4096$, where $0 \leq n \leq 64$. Thus it will be understood that the cascaded interpolation filter permit progressively finer interpolation to be achieved.

Consider now the example given initially, of converting a 13.5 MHz input digital video signal to a 4 fsc output digital video signal. Suppose that each sample is an 8-bit PCM sample, and that each interpolator in a cascaded series comprises a 16-tap digital filter with 64 tap sets stored in RAM. Then the timing resolution for the first interpolation is approximately 74 nsec/64, that is approximately 1.1 nsec. For the second interpolation the timing resolution is approximately 1.1 nsec/64, that is approximately 18 psec, which gives ample resolution.

A digital signal interpolator arrangement based on this example will now be described with reference to FIG. 3. The arrangement comprises the digital phase detector 3 which supplies a control signal characteristic of the required sample rate conversion, and the derivation of which will be described below, to a programmable read only memory (PROM) 10, and by way of a delay 11 to a PROM 12. The control signal may consist of twelve bits, of which the six most significant bits are supplied to the PROM 10 and the six least significant bits are supplied to the PROM 12. Similar interpolators 13 and 14 are formed as respective single integrated circuit chips, and respectively comprise RAMs 13R and 14R, and digital filters 13F and 14F. Each of the digital filters 13F and 14F is a 16-tap filter and each of the RAMs 13R and 14R stores 64 tap sets, each comprising sixteen weighting coefficients to be selectively dynamically supplied to the associated filter 13F or 14F in synchronism with the input samples supplied to the associated filter 13F or 14F.

The input digital signal is supplied to the filter 13F, the output (coarse interpolated samples) from which is supplied to the filter 14F, from which the output digital signal (finely interpolated samples) is derived. The delay 11 is to compensate for processing delay in the filter 13F.

The number of cascaded interpolators required in any case will depend on the sample rate conversion required, the number of bits per sample, the number of taps per filter, and the number of tap sets per filter. For example, to achieve a sampling accuracy of 0.15 nsec for 8-bit samples with sixteen tap digital filters with two tap sets, would require nine interpolators in cascade.

The above-described form of digital signal interpolation is disclosed and claimed in our copending UK patent application 9002558.6. An example of a form of phase detector suitable for use as the digital phase detector 3 of FIGS. 1 and 3, and with which the present invention is more particularly concerned will now be described with reference to FIGS. 4 to 7.

Basically what the digital phase detector is required to do is to decide sample point by sample point of the output digital signal how each sample is related in phase, that is in time, to sample points of the input digital signal. In other words, the offset of each sample point of the output digital signal relative to sample points of the input digital signal needs to be determined, and in dependence thereon, the digital phase detector supplies a control signal to effect selection of the appropriate sets of weighting coefficients from the RAMs 13R and 14R (FIG. 3) for supply to the individual filters 13F and 14F (FIG. 3). This needs to be done with a phase error less than that which would cause a magnitude error of half of one quantum when sampling at the higher of the two input frequencies.

The digital phase detector arrangement to be described is conveniently considered in two parts; the phase detector itself, and the circuit for filtering or smoothing the output of the phase detector.

Referring to FIG. 4, the phase detector itself has respective inputs to which are supplied the input clock signals CLK1 and CLK2. The clock signal CLK1 may be considered as the reference, so may for example be a studio reference, but in fact the reference may be supplied to either input. In a video application, the clock signal CLK1 may have a frequency of 13.5 MHz, while the clock signal CLK2 has a frequency of 4 fsc, that is about 17.73 MHz.

The phase detector comprises a phase-locked loop (PLL) circuit 20 with an associated voltage controlled oscillator 21 having a nominal frequency of 17.73 MHz, three counters 22 to 24, each formed by a binary divider, and a latch circuit 25, connected as shown. The divisions effected by the counters 22 to 24 will be selected in dependence on the application, but in the case of the video interpolation considered here, the counters 22 to 24 may each divide by 4096, so that the output supplied by the counter 24 to the latch circuit 25 is a 12-bit output. The output of the counter 24 then in effect clocks the output of the counter 23 by strobing the count in the latch circuit 25 to provide a 12-bit output. In addition to this, the output of the counter 24 forms a trigger clock signal tc referred to in more detail below.

FIGS. 5A and 5B show diagrammatically the timing of the outputs of the counters 22 and 23 respectively, each of which counts from 0 to $n-1$ repetitively. FIG. 5C shows diagrammatically the strobe pulses corresponding to the count of $n-1$ in the counter 23. The phase of these strobe pulses relative to a count of 0 in the counter 22 may be considered, in modulo form to be a; a+b; a+2b; etc., so ideally the phase difference (in modulo terms) is in each case equal to b, that is, there is a constant rate of increase of phase difference. In practice, however, there will be some jitter in the 12-bit output from the latch circuit 25, and the purpose of the filter circuit of FIG. 6 is to smooth out this jitter.

Figure 6:
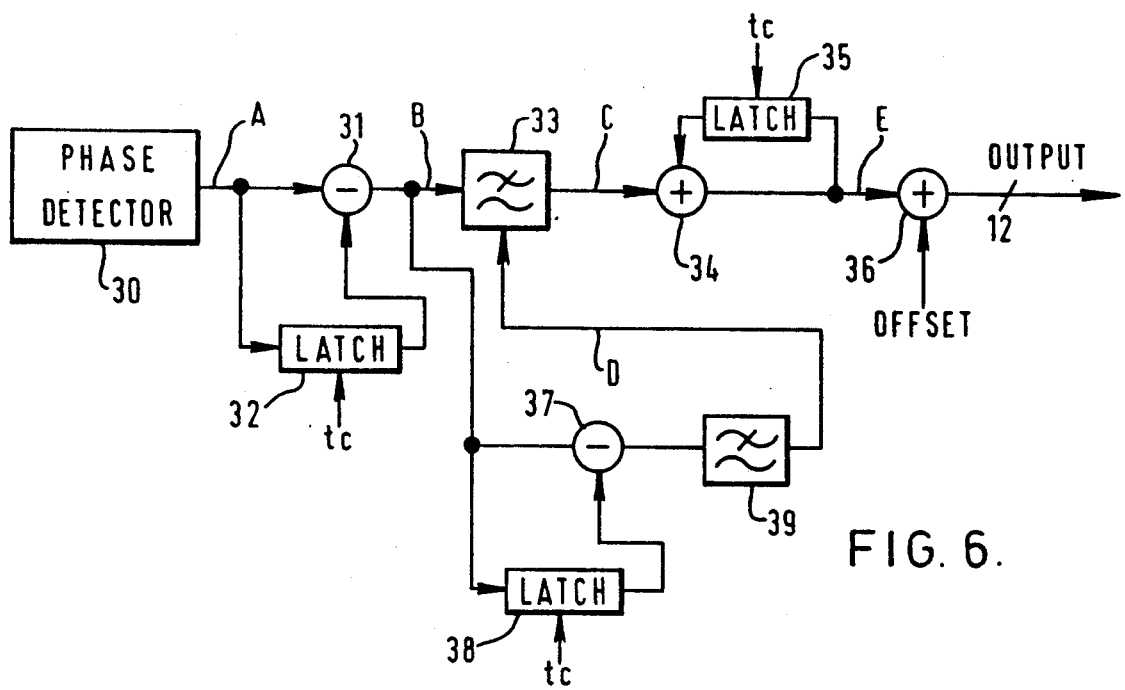
FIG. 6 shows the digital phase detector arrangement in more detailed block diagrammatic form.

Referring to FIG. 6, the phase detector 30 is the phase detector of FIG. 4. The 12-bit output thereof is in effect differentiated, to derive b on a modulo basis; low-pass filtered, to remove the jitter or noise; and integrated, to derive a new 12-bit output which is free of the jitter.

The differentiation is effected by a modulo $2^n$ subtractor 31 and a latch circuit 32, to each of which is supplied the 12-bit output of the phase detector 30. The latch circuit 32 is strobed by the trigger clock signal tc to provide a second input to the subtractor 31, the output of which is supplied to a low-pass filter 33 which has a very narrow pass-band, for example only a few Hertz or even only a fraction of a Hertz.

The integration is effected by a modulo $2^n$ adder 34 which receives the output of the low-pass filter 33, and a latch circuit 35 which receives the output of the adder 34. The latch circuit 35 is strobed by the trigger clock signal tc to provide a second input to the adder 34, the output of which is the required 12-bit phase detector output. If required, this output can be supplied to a further adder 36 where a static offset can be added to set a specific phase difference relative to the input. Although not shown, all the connections in FIG. 6 are 12-bit buses.

Figure 7A:
FIGS. 7(A)–7(E) show waveform diagram for explaining the operation of the digital phase detector arrangement of FIG. 6.
Figure 7B:
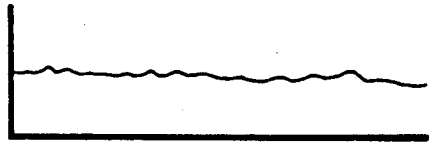
Figure 7C:
Figure 7D:
Figure 7E:
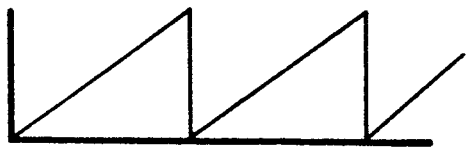

The waveforms of FIGS. 7A to 7C and 7E represent the signals at the points A to C and E respectively in FIG. 6. Thus FIG. 7A represents the output of the phase detector 30, which exhibits jitter or noise. FIG. 7B represents the result of differentiating the phase detector output, and may be considered as a velocity; that is, the value b. FIG. 7C represents the filtered velocity; that is, from which the jitter or noise has been removed. FIG. 7E represents the final output after integration, and is free of jitter.

The 12-bit final output is supplied to the filters 13F and 14F (FIG. 3), the most significant six bits controlling selection of the weighting coefficient for the filter 13F, and the least significant six bits controlling selection of the weighting coefficient of the filter 14F.

As mentioned above, the low-pass filter 33 has a very narrow pass-band, and this can cause problems if the velocity (b) is not reasonably steady, that is, is subject to an acceleration, such as may occur transiently, for example, at start-up, or on occurrence of a temporary fault, or in a video tape recorder application due to mechanical slew. To enable the output to respond rapidly in such circumstances, the output of the subtractor 31 may be supplied to a further differentiator comprising a modulo $2^n$ subtractor 37 and to a latch circuit 38, which is strobed by the trigger clock signal tc thereby to supply a second input to the subtractor 37. The output of the subtractor 37 is supplied to a low-pass filter 39, the output of which represents the acceleration, and can form a control signal to effect switching of the pass-band of the low-pass filter 33 to a wider band at times when the acceleration has a significant value. When used in this way it is preferable to use a symmetrical finite impulse response filter as the filter 33, to avoid changing the filter group delay. FIG. 7D represents the signal at the point D, that is the output of the low-pass filter 39 or the acceleration, which, as shown, will have a steady near-zero value when the arrangement is in stable operation.

The frequencies mentioned, and the number of bits in the signals mentioned are by way of example only, and say in an interpolator for converting an audio signal from a sampling frequency of 48 kHz to a sampling frequency of 44.4 kHz, an 18-bit phase detector output may be required, associated with 18-bit outputs throughout the remainder of the circuit of FIG. 6.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. In combination with a digital phase detector for deriving a digital output signal representing phase differences between two input clock signals supplied to the phase detector, circuit means for reducing jitter in said output signal comprising:
    means for differentiating said output signal to produce a differentiated signal;
    low-pass filter means for low-pass filtering said differentiated signal to produce a filtered signal; and
    means for integrating said filtered signal to produce a further digital output signal from which at least some jitter has been removed by said low-pass filter means.

2. The combination according to claim 1 wherein said circuit means for reducing jitter further comprises means for differentiating said differentiated signal to produce a control signal for controlling a pass-band of said low-pass filter means.

3. The combination according to claim 2 wherein said control signal is supplied to said low-pass filter means by way of another low-pass filter means.

4. The combination according to claim 1, wherein said two input clock signals have respective frequencies and wherein said digital phase detector includes first and second counter means for dividing the frequencies of said two input clock signals in the same ratio and supplying respective output signals therefrom, latch circuit means for latching the output signal of said second counter means to produce said digital output signal, and a phase-locked loop circuit controlled by the output signal of said first counter means and including third counter means supplying an output signal therefrom for strobing said latch circuit means.

5. The combination according to claim 4 wherein said means for differentiating said output signal comprises latch means which receives said digital output signal and is strobed by the output signal of said third counter means, and a modulo subtractor receiving said digital output signal and an output signal from said latch means for producing said differentiated signal.

6. The combination according to claim 4 wherein said means for integrating comprises latch means, which is strobed by the output signal of said third counter means, and a modulo adder receiving said filtered signal and an output signal from said latch means for producing said further digital output signal.

7. The combination according to claim 4 wherein said circuit means for reducing jitter further comprises means for differentiating said differentiated signal to produce a control signal for controlling a pass-band of said low-pass filter means.

8. The combination according to claim 7 wherein said means for differentiating said differentiated signal comprises latch means, which receives said differentiated signal and is strobed by the output signal of said third counter means and a modulo subtractor receiving said differentiated signal and an output signal from said latch means for producing said control signal.

9. The combination according to claim 7 wherein said control signal is supplied to said low-pass filter means by way of another low-pass filter means.

10. A digital signal interpolator apparatus for interpolating an input digital signal having a first sample rate so as to derive a sample-rate converted output digital signal having a second sample rate different from said first sample rate, said digital signal interpolator apparatus comprising:
    a cascaded series of multi-tap interpolation filter means, each of said interpolation filter means having a plurality of selectively employed tap sets;

digital phase detector means receiving first and second clock signals having frequencies corresponding to said first and second sample rates and including means for providing a control signal representing phase differences between said first and second clock signals;

circuit means for reducing jitter in said control signal including means for differentiating said control signal to produce a differentiated signal, low-pass filter means for low-pass filtering said differentiated signal to produce a filtered signal, and means for integrating said filtered signal to produce a smoothed control signal from which at least some jitter has been removed;

means for supplying said smoothed control signal to each of said interpolation filter means for selecting one of said tap sets to be employed in the respective interpolation filter means;

means to supply said input digital signal to a first of said interpolation filter means of said series; and means to derive said sample-rate converted output digital signal from a last of said interpolation filter means of said series.

11. The digital signal interpolator apparatus according to claim 10, further comprising random access memory means for storing said tap sets.

12. The digital signal interpolator apparatus according to claim 10 wherein each said interpolation filter means includes random access memory means for storing the respective selectively employed tap sets and wherein each said interpolation filter means is formed as an integrated circuit.

13. The digital signal interpolation apparatus according to claim 10, further comprising full resolution digital connections between each said interpolation filter means in said series and the next said interpolation filter means in said series.

14. The digital signal interpolation apparatus according to claim 10 wherein each said interpolation filter means includes a 16-tap digital filter having 64 of said selectively employed tap sets.

15. The digital signal interpolation apparatus according to claim 14 wherein said cascaded series of interpolation filter means comprises two said interpolation filter means.

* * * * *